United States Patent [19]

Talbot

[11] 4,006,429
[45] Feb. 1, 1977

[54] HOMODYNE AUTOMATIC FREQUENCY CONTROL CIRCUIT
[75] Inventor: Daniel B. Talbot, Cornwell Heights, Pa.
[73] Assignee: Jerrold Electronics Corporation, Horsham, Pa.
[22] Filed: Sept. 26, 1975
[21] Appl. No.: 617,143
[52] U.S. Cl. .................................. 331/14; 325/148; 331/23; 332/19
[51] Int. Cl.² ...................... H03B 3/10; H03C 3/00
[58] Field of Search ................. 332/19; 331/1 R, 14, 331/23; 325/148

[56] References Cited
UNITED STATES PATENTS

| 3,297,965 | 1/1967 | Chadima | 332/19 |
| 3,614,648 | 10/1971 | Byrne | 331/14 |
| 3,857,108 | 12/1974 | Kanow | 331/14 |

Primary Examiner—Siegfried H. Grimm

[57] ABSTRACT

Homodyne automatic frequency control circuitry maintains the mean or center output frequency of a controlled oscillator, e.g., the output of a voltage controlled oscillator effecting frequency modulation, equal to the output frequency of a reference oscillator. The composite AFC circuitry employs ganged sampling switches and a common mode error obviating common frequency detector (e.g., a discriminator) to alternately store voltages representative of the reference and controlled oscillator frequencies in capacitors connected to the inputs of a difference amplifier. The difference amplifier acts through an integrator to supply any necessary correction potential to the control port of the controlled oscillator when the signals stored in the two capacitors differ, signalling that the mean output frequency of the controlled oscillator has departed from that of the reference oscillator.

1 Claim, 1 Drawing Figure

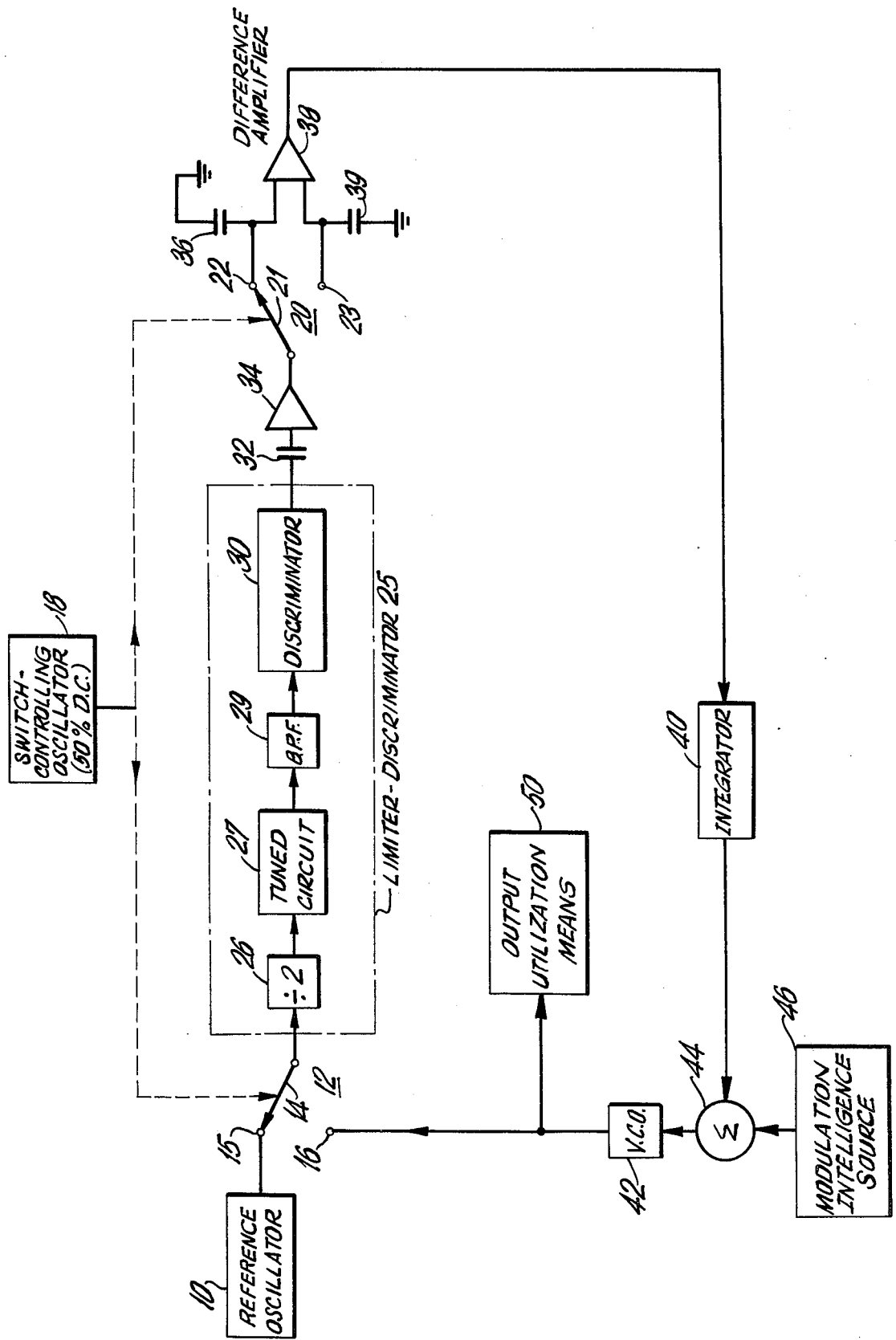

HOMODYNE AUTOMATIC FREQUENCY CONTROL CIRCUIT

DISCLOSURE OF THE INVENTION

This invention relates to electronic circuits and, more specifically, to a homodyne automatic frequency control circuit useful, for example, to maintain the center frequency of a frequency modulated signal at a frequency value corresponding to that generated by a reference oscillator.

Automatic frequency control (herein "AFC") apparatus has heretofore been employed to control a generated frequency, e.g., the center frequency of a transmitted intelligence bearing frequency modulated carrier. Such AFC circuitry typically employs a reference oscillator distinct in frequency from the desired carrier center frequency, a mixer being utilized to derive a frequency difference signal by beating the outgoing carrier with the signal furnished by the reference oscillator. The difference signal is then passed through a frequency-to-voltage transfer network, e.g., a discriminator, slope detector, or the like, to derive an output potential proportional to the difference frequency. The feedback loop then maintains the discriminator output at a constant reference level, thereby presumably also maintaining the difference frequency (and the output carrier frequency) at constant prescribed values.

However, the difficulty with such systems arises when the frequency-measuring circuitry employed, such as the discriminator, changes its transfer characteristic, for example, with changes in temperature or other ambient conditions, with time in an aging process, or the like. The conventional AFC circuitry operates to maintain the discriminator output constant as above noted and, if the discriminator characteristic changes, the composite AFC loop will accordingly vary the outgoing frequency from its desired value.

It is an object of the present invention to provide improved AFC circuitry to maintain constant the frequency of a desired monitored wave.

More specifically, it is an object of the present invention to maintain the frequency of a desired signal, e.g., the carrier of a frequency modulation wave, equal to that of a reference oscillation.

The above and other objects of the present invention are realized in a specific, illustrative, automatic frequency control circuit which employs a voltage controlled oscillator — as for generating a frequency modulated output wave, a reference oscillator having an output frequency equal to the desired center frequency for the controlled output wave, and a difference amplifier having storage elements, e.g., capacitors, connected to its inverting and non-inverting input terminals. The output of the difference amplifier supplies a bias potential to control the center frequency of the voltage controlled oscillator, preferably via an integrating network. A discriminator is employed in conjunction with ganged transfer switches to load one of the difference amplifier storage capacitors with a signal proportional to the frequency of the reference oscillator, and to load the other storage capacitor with a voltage level proportional to the average frequency output of the voltage controlled oscillator.

For its mode of operation, the homodyne AFC loop of the instant invention periodically connects the reference oscillator to the first difference amplifier storage capacitor via the ganged sampling switches and intermediate discriminator for a fixed, predetermined period of time which is long compared to the output period for the reference oscillation, thereby storing in this first capacitor a voltage level proportional to the frequency output of the reference oscillator. Similarly, during alternate, intermediate periodic time intervals of equal duration, the second difference amplifier capacitor is loaded with a voltage proportional to the average or center frequency of the output wave, e.g., the frequency modulation signal. If the voltages on the two capacitors are substantially the same, signifying that the average controlled oscillator output frequency is equal to that of the reference oscillator, no correction signal is developed at the difference amplifier output. However, if the voltages stored in the two capacitors are unequal by a meaningful amount, the difference amplifier develops an output correction control voltage to bring the variable frequency oscillator back into match with the output frequency of the reference oscillator.

The above and other features and advantages of the present invention are realized in a specific, illustrative, homodyne automatic frequency control circuitry described hereinbelow in conjunction with the accompanying drawing, which schematically depicts such AFC apparatus.

Referring now to the drawing, there is shown specific illustrative AFC circuitry for maintaining the average output frequency generated by a voltage controlled oscillator 42 equal to the output frequency of a reference oscillator 10. In the context of the drawing and for purposes of illustration only, the output of the voltage control oscillator 42 is assumed to comprise a frequency modulated signal, having an average or center frequency deviated in accordance with a modulating signal supplied by an intelligence signal source 46 connected to the voltage controlled oscillator 42 control port via a linear summing network 44. Thus, for purposes of illustration and not limitation, the output of the voltage control oscillator 42 may comprise a 4.5 megacycle sound carrier for a television sound program and the modulation intelligence source 46 may comprise a source of audio signals. For such an assumed case, the reference oscillator 10 would supply a preferably well regulated 4.5 megacycle oscillation, and the output of the voltage control oscillator 42 may be supplied to appropriate output utilization means 50, e.g., a transmitter for radiating a television program, a cable driver for a CATV or MATV network, or the like.

A first sampling switch 12 is employed to alternately connect the outputs of the reference oscillator 10 or the voltage controlled oscillator 42 to the input of a limiter-discriminator 25, and a second sampling switch 20 employed to connect the output of the limiter-discriminator 25 to one of two storage capacitors 36 and 39 respectively connected to the inputs of a difference amplifier 38. The switches 12 and 20 are ganged and are operated under control of a switch-controlling oscillator 18 which exhibits a low oscillation rate vis-a-vis the frequency of the element 10 (and also the like center frequency of the voltage controlled oscillator 42 output). Thus, for example, the switch oscillator 18 may exhibit a rate of only a few cycles per second, which is very much smaller than the assumed 4.5 megacycle carrier rate. Further, the switch controlling oscillator 18 preferably exhibits a 50% duty cycle such that the transfer members 14 and 21 of the switches 12 and 20 respectively dwell on the two possible input terminals 15 and 16, and 22 and 23 one half of the time. The switches 12 and 20 are shown schematically in the drawing. It will be appreciated by those skilled in the art that such switches will advantageously be of an electronic solid state configuration, e.g., FET switches and/or digital gates which are opened and closed under control of the binary output of the oscillator 18 although simple electromechanical switches (e.g., reed switches) may suffice.

For completeness it is observed that an alternating current coupling capacitor 32 and buffer amplifier 34 may be employed intermediate the output of the limiter-discriminator 25 and the switch 20, and that an integrator 40 couples the output of the difference amplifier 38 to the control port of the voltage control oscillator 42 acting through the summing network 44. The integrator limits the frequency response of the composite AFC loop to that desired.

The manner in which the above described circuit arrangement depicted in the drawing functions will now be considered. Assume first that the conceptual transfer members 14 and 21 of the switches 12 and 20 are in their upper positions shown in the drawing — as under control of a first output polarity from the switch oscillator 18. With this circuit condition obtaining, the output wave from the reference oscillator 10 gives rise to a particular, frequency dependent, substantially D.C. potential at the output of the limiter-discriminator 25 which may take any form, e.g., a conventional ratio or slope detector or discriminator, a separate limiter being employed if desired. Other specific forms of the element 25 are discussed hereinbelow. The output voltage level generated by the limiter-discriminator 25 is coupled by the capacitor 32 (which exhibits a pass band beginning well below the switch frequency of the oscillator 18) and the buffer amplifier 34 to load the storage capacitor 36. Since the half-period of the switch controlling oscillator encompasses many cycles of the monitored oscillator 10, the D.C. level in the capacitor 36 represents a mean or average value over the interval.

At some later time, during the next half cycle of the switch oscillator 18, the switches 12 and 20 switch to their alternate state engaging terminals 16 and 23, respectively. In this orientation, the frequency output of the voltage controlled oscillator 42, rather than that of the reference oscillator 10, is converted to a voltage level by the limiter-discriminator 25, and is impressed in the capacitor 39 via the coupling capacitor 32, buffer amplifier 34 and switch 20.

This alternating mode of functioning continues for each cycle of the switch oscillator 18, such that the capacitor 36 is continuously maintained at a voltage level which characterizes the output frequency of the reference oscillator 10 while the capacitor 39 is maintained at a potential characterizing the output frequency of the voltage control oscillator 42 — the absolute values of the two voltages depending upon the transfer characteristic of the same discriminator 30.

If the voltages stored in the capacitors 36 and 39 are equal, the difference amplifier 38 supplies no output correction potential to vary the center frequency of the voltage controlled oscillator 42. When such an equal stored potential condition prevails, the average frequencies of the voltage control oscillator 42 and oscillator 10 are thus equal as desired. Moreover, it is observed at this point that this condition of equality is substantially independent of any changes which may occur in the transfer characteristic of the limiter-discriminator 25 since the voltage stored in each of the capacitors 36 and 39 was developed at substantially the same time, i.e., during alternate half cycles of the oscillator 18 which occur within a fraction of a second of one another.

Conversely, if the voltages in the capacitor 36 and 39 differ, indicating that the average output frequency of the voltage controlled oscillator 42 has departed from the output frequency of the oscillator 10, the amplifier 38 generates an output level which depends upon the magnitude and polarity of the input signal difference. The output of the amplifier 38 then acts through the integrator 40 and the summing network 44 to correct the voltage applied to the voltage control oscillator 42 in a direction to obviate the frequency difference between the oscillators 10 and 42, thus bringing the mean frequency output of the voltage control oscillator 42 to the proper value.

As above noted, the limiter-discriminator 25 may simply comprise any of the classic analog discriminator, or limiter-discriminator circuits, e.g., a ratio or slope detector, discriminator, or the like. However, when such analog circuits are employed, I have found it preferable to employ wave form regenerating circuitry to obviate the frequency masking affects of harmonic and other distortion possibly present in the outputs of the oscillators 10 or 42. Thus, for example, the limiter-discriminator 25 may comprise a digital binary divider, e.g., a divide-by-two flip-flop 26 cascaded with a tuned circuit 27 which responds to the reference frequency divided by two, and a band pass filter to reject the undesired higher frequency product, all of which precede a discriminator 30. In one other alternative embodiment among others, a digital discriminator may be used, the circuitry 25 simply comprising such as a zero-crossing detector driving a monostable multivibrator and low pass filter to provide for frequency-to-voltage conversion (the ultimate office for element 25) by a form of integrated pulse rate modulation.

The above arrangement has thus been shown to maintain the average or mean output of a variable oscillator 42 in precise equality with the output frequency of a reference oscillator 10. Accordingly, the end objective of homodyne AFC control is achieved, the circuit reference employed (the oscillator 10) being equal to the desired output frequency. Further, by employing the same frequency-to-voltage conversion element (e.g., the transfer characteristic of the element 30), the composite AFC loop becomes substantially independent and drifts, non-linearities or other common mode undesirable attributes of the discriminator 30 which get nulled out by subtracting the two inputs of the amplifier 38.

The above described arrangement is merely illustrative of the principles of the present invention. Numerous modifications and adaptations thereof will be readily apparent to those skilled in the art without departing from the spirit and scope of the present invention.

What is claimed is:

1. In combination, a reference oscillator, a controlled oscillator having an output port and a control port, a difference amplifier having first and second input ports and an output port connected to said control port of said controlled oscillator, first and second storage means connected to said first and second input terminals of said difference amplifier, frequency-to-voltage converter means, first controlled switching means for alternately connecting the input of said frequency-to-voltage converter means to said reference oscillator and to the output of said controlled oscillator, and second switching means operable in synchronization with said first switching means for alternately connecting the output of said frequency-to-voltage converter means to said first and second storage means, wherein said frequency-to-voltage converter means comprises a discriminator, and wherein said frequency-to-voltage converter means further comprises the cascaded connection of a frequency divider, tuned circuit, and band pass filter.

* * * * *